(12) United States Patent
Sharma et al.

(10) Patent No.: US 6,940,747 B1
(45) Date of Patent: Sep. 6, 2005

(54) MAGNETIC MEMORY DEVICE

(75) Inventors: Manish Sharma, Sunnyvale, CA (US); Frederick A. Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 9 days.

(21) Appl. No.: 10/854,858

(22) Filed: May 26, 2004

(51) Int. Cl.[7] .................. G11C 11/00; G11C 11/14; G11C 11/15
(52) U.S. Cl. ................. 365/158; 365/171; 365/173
(58) Field of Search ............... 365/158, 171, 365/173

(56) References Cited

U.S. PATENT DOCUMENTS

| | | | |
|---|---|---|---|
| 6,256,224 B1 * | 7/2001 | Perner et al. ............. | 365/171 |
| 6,473,336 B1 * | 10/2002 | Nakajima et al. ......... | 365/171 |
| 6,693,826 B1 * | 2/2004 | Black et al. ............... | 365/173 |
| 6,765,821 B2 * | 7/2004 | Saito et al. ............... | 365/171 |
| 6,795,355 B2 * | 9/2004 | Ooishi ...................... | 365/158 |
| 6,826,079 B2 * | 11/2004 | Tran ......................... | 365/171 |
| 6,831,855 B2 * | 12/2004 | Kishi et al. ............... | 365/158 |

* cited by examiner

Primary Examiner—Trong Phan

(57) ABSTRACT

The present invention provides a magnetic memory device. An embodiment of the present invention includes a magnetic memory cell that is switchable between two states offering electrical resistance which are detectible by a sense current though the magnetic memory cell. The device includes a field effect transistor (FET) arrangement which has a source and a drain. The source and the drain are connected by a connecting element which projects from a portion of the device and which has an electrical conductivity that varies in response to a gate voltage applied to the connecting element. The magnetic memory cell is in electrical communication with the connecting element so that at least a portion of the sense current is in use associated with a corresponding gate voltage and the FET arrangement amplifies at least a portion of the sense current.

26 Claims, 5 Drawing Sheets

MAGNETIC MEMORY DEVICE

FIELD OF THE INVENTION

The present invention relates to a magnetic memory device and particularly, although not exclusively, to an array of magnetic memory cells.

BACKGROUND OF THE INVENTION

Non volatile magnetic random access memory (MRAM) devices have the potential to replace volatile dynamic random access memory (DRAM) devices and static random access memory (SRAM) devices in some applications. The MRAM devices typically comprise an array of memory cells such as tunnelling magneto-resistance (TMR), colossal magneto resistance (CMR), and giant magneto-resistance (GMR) memory cells.

In general, MRAM cells include a data layer and a reference layer. The data layer is composed of a magnetic material and in a write operation the magnetisation of the data layer can be switched between two opposing states by an applied magnetic field and thus binary information can be stored. The reference layer usually is composed of a magnetic material whose magnetization direction serves as a reference with respect to which the orientation of the data layer is measured. The reference layer could be either pinned, in which case its magnetisation is fixed due to an adjacent antiferromagnetic layer, or soft, in which case its magnetization is set dynamically.

For example, in a TMR cell, the data layer and the reference layer are separated by a thin dielectric layer which is arranged so that a tunnelling junction is formed. Any material has two types of electrons which have spin up and spin down polarities. In case of a magnetic layer that has a magnetisation, more electron spins have one orientation compared with the other one which gives rise to the magnetisation. The electrical resistance through the dielectric layer is dependent on the relative orientations of the magnetizations in the data and reference layers. This is the tunnelling magneto-resistance (TMR) effect and the state of the data layer can be determined by a sense current through the layers.

If the magnetic memory device includes an array of such magnetic memory cells, the individual magnetic memory cells are usually connected by column and row conductors. The purpose of these column and row conductors is twofold. For switching the magnetization of a data layer in a particular magnetic memory cell which is located at the cross-point of a column and a row conductor, electrical currents are directed through the crossing row and column conductor and the associated magnetic field is used to switch magnetization of the data layer.

For reading the information stored in such a memory cell a sense current is directed through the crossing column and row conductors and through a selected magnetic memory cell. However, since a large number of magnetic memory cells are at the cross points of a large number of column and row conductors, the sense current is not exclusively directed through the magnetic memory cell that is to be read, but a portion of the sense current also penetrates parallel paths through adjacent memory cells. It is therefore difficult to select only a particular MRAM cell for a read-out operation.

The sense currents are very small currents and may be in the nA range. Therefore, the sense currents are difficult to measure and the difficulty to select only one magnetic memory cell in a readout process further complicates the measurement of a sense current. There is a need for an improved technical solution.

SUMMARY OF THE INVENTION

Briefly, a magnetic memory device embodiment of the present invention includes a magnetic memory cell that is switchable between two states of differing electrical resistance which are detectible by a sense current through the magnetic memory cell. The device includes a field effect transistor (FET) arrangement which has a source and a drain. The source and the drain are connected by a connecting element which projects from a portion of the device and which has an electrical conductivity that varies in response to a gate voltage applied to the connecting element. The magnetic memory cell is in electrical communication with the connecting element so that at least a portion of the sense current is in use associated with a corresponding gate voltage and the FET arrangement amplifies at least a portion of the sense current.

The invention will be more fully understood from the following description of embodiments of the memory device. The description is provided with reference to the accompanying drawings.

DETAILED DESCRIPTION OF EMBODIMENTS

Figure 1:
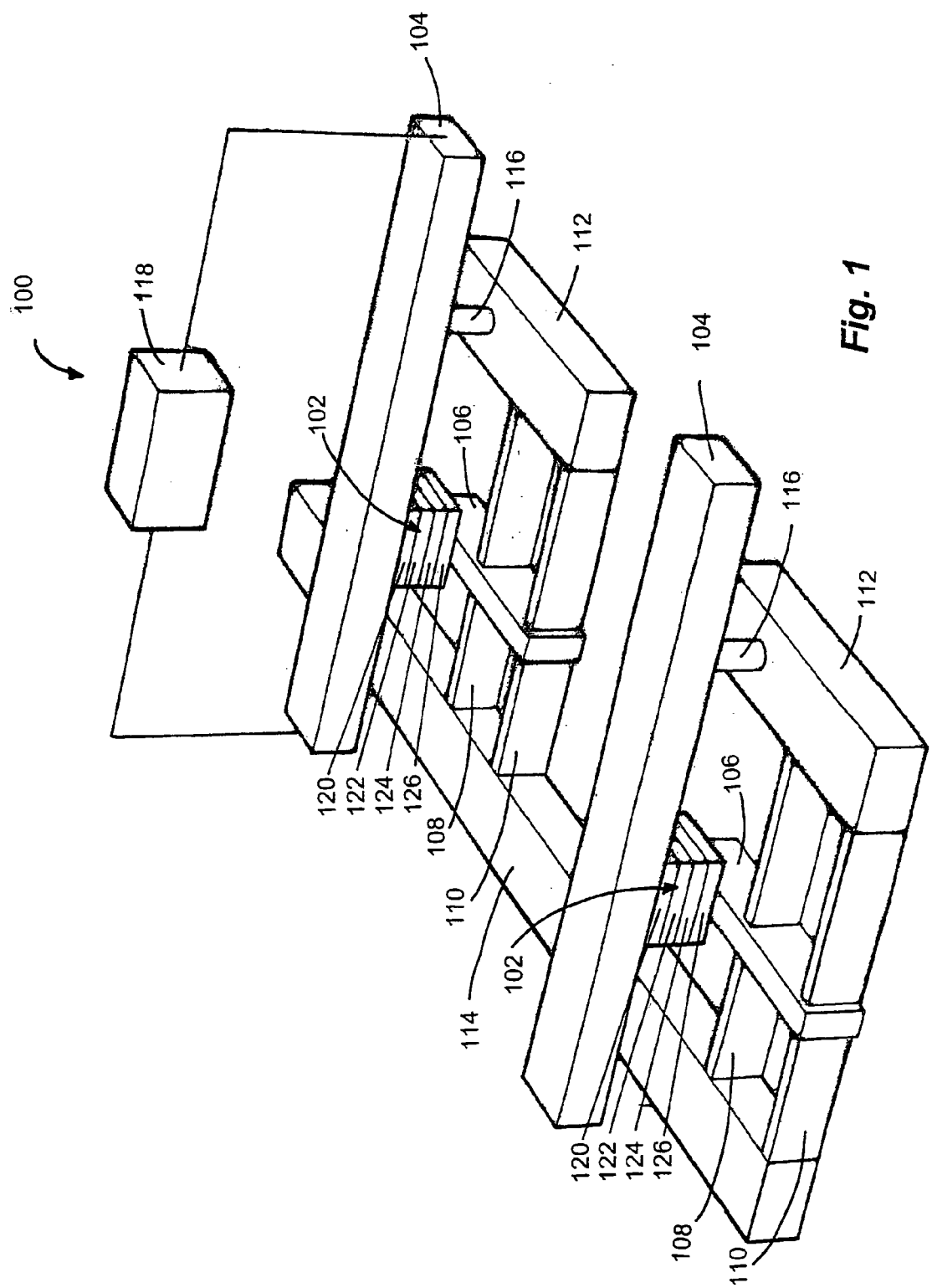
FIG. 1 is a perspective diagram of a magnetic memory device according to an embodiment of the invention.

Referring initially to FIG. 1, a magnetic memory device (MRAM) 100 according to an embodiment is now described.

The MRAM 100 includes individual tunnelling magneto-resistance memory (TMR) cells 102. Each cell 102 is electrically connected with bit line 104. Each magnetic memory cell 102 is positioned on a gate electrode 106 which is in electrical contact with two connecting elements which in this embodiment are fins 108 and 110 of a finFET arrangement. The fins 108 and 110 connect source 114 and drain 112 of the finFET arrangement. In this embodiment the bit line 104 is electrically connected with drain 112 by connector 116.

When a current is applied along bit line 104, a magnetic field surrounds the bit line 104 which can be utilised to switch the magnetisation of the magnetic memory cell 102. FIG. 1 schematically indicates a circuit unit 118 that generates a voltage potential between the ends of bit line 104. In this embodiment the source 114 is operable as a word line and the circuit may also generate a voltage potential along the source/word line 114. For clarity, electrical connections to the circuit unit 118 are not shown for the source/word line 114.

Only two magnetic memory cells 102 and finFET arrangements are shown in FIG. 1. It is to be appreciated however, that the device 100 typically includes a much larger number of memory cells 102 and finFET arrangements such as a few thousand.

In this embodiment, each magnetic memory cell 102 includes a data layer 120, a dielectric layer 122 and a reference layer 124. Each magnetic memory cell 102 is coupled to the respective gate electrode 106 via a dielectric layer 126. The dielectric layers 122 and 126 are thin enough so that tunnelling junctions are formed between data layers 120 and reference layers 124 and between reference layers 124 and gate electrode 106 respectively. It is to be appreciated that in a variation of the embodiment shown in FIG. 1 the order of the layers in each magnetic memory cell 102 may be reversed.

To read information stored in each memory cell 102, a voltage potential is applied between bit line 104 and word line 114. The voltage potential causes a sense current through a selected magnetic memory cell 102 which results in a voltage across the tunnelling junctions at dielectric layer 122 and dielectric layer 126. Because of the voltage potential at dielectric layer 126, charge carriers are induced in the fins 108 and 110 which influence the conducting properties of the fins 108 and 110. A current between drain 112 and source 114 therefore is proportional to the voltage at dielectric layer 126. Therefore, the finFET arrangement can be used to amplify the sense current. Consequently, measurement of the sense current is facilitated.

In general finFET arrangements need to be very small, typical diameters of the fins are of the order of 50–80 nm. Ideally, the fins have a width that is below the lithographic limit. The small size of the finFET arrangements are advantageous for high density MRAM devices having very small MRAM cells as the finFET arrangements need very little space and are compatible with the very small MRAM cells.

The tunnelling junctions at each layer 122 and at each layer 126 do not necessarily have the same dimensions. In the embodiment shown in FIG. 1 the tunnelling junctions at layers 126 are smaller than the tunnelling junctions at layers 122 as the gate electrodes 106 contact the layers 126 within an area that is smaller than the area within which each reference layer 124 and each data layer 120 contacts each layer 122. The voltage across the layers 126 therefore is larger than that across layers 122.

The device 100 also includes a read-circuit for generating the sense current through the magnetic memory cells 102 during a read operation. During the read operation, a constant supply voltage is supplied between the bit line 104 and word line 114. The voltage is provided by an external circuit which is not shown in order to simplify the description.

It is to be appreciated that in alternative embodiments other techniques may be used to read-out information stored in an MRAM cell. For example, the capacitance of the MRAM/finFET arrangement is strongly dependent on the state of the MRAM. Therefore, the state of the MRAM may also be determined by measuring the time constant of the MRAM/finFET arrangement.

The finFET arrangements may include any number of fins. Layers 106 may in a variation of the embodiment shown in FIG. 1 be resistive layer so that a voltage at each layer 106 is generated because of the inherent resistance of the layer 106 and not because the layer 106 provides a tunnelling junction.

Further, an external voltage may be applied to the gate electrode 106 which influences the conductivity of the fins 108 and 110. The finFET arrangement may provide a switch and the selective application of the external gate voltage to gate 106 influences the conductivity of the fins 108 and 110 so that a respective memory cell 102 can be selected for a readout process.

For example, if the conductivity of the fins 108 and 110 associated with each unselected magnetic memory cell 102 of the array is low and the conductivity of the fins of the finFET arrangement associated with a selected memory cell 102 is relatively high, sense current through unselected memory cells can be reduced. Therefore, the device has the significant advantage that the finFET arrangement amplifies the sense currents and also reduces sense currents through unselected memory cells 102. Consequently, the readout of a selected MRAM cell 102 is greatly facilitated.

In this embodiment, the data layer 120 is composed of nickel iron (NiFe), the reference layer 124 is composed of cobalt iron (CoFe) and the dielectric layers 122 and 126 are composed of aluminium oxide. All layers have the same planar area of approximately 150 nm×300 nm, and the reference layer 124, the data layer 120 and the dielectric layers 122 and 126 have a thickness of approximately 2 nm, 3.5 nm, 1.2 nm, and 2 nm, respectively. Alternatively the dielectric layers 122 and 126 may be composed of $Al_2O_3$, AlN, $SiO_2$, $Si_3N_4$, BN, MgO and $Ta_2O_5$. If the layer 106 is a resistive layer, the layer is to be composed of Si or alternatively of Ge, Se, C, SiC, $TaO_2$, WSi, CoSi, FeSi, PtSi, TaN, FeAlN or SiN.

The bit lines 104, connecting elements 116, gate electrodes 106 and the word line 114 are typically composed of a conductive of materials such as copper or aluminium. The fins 108 and 110 are typically composed of n-type or of p-type silicon and have a thickness of approximately 50 nm. The drains 112 and the source 114 are heavily doped regions in the silicon substrate.

Figure 2A:
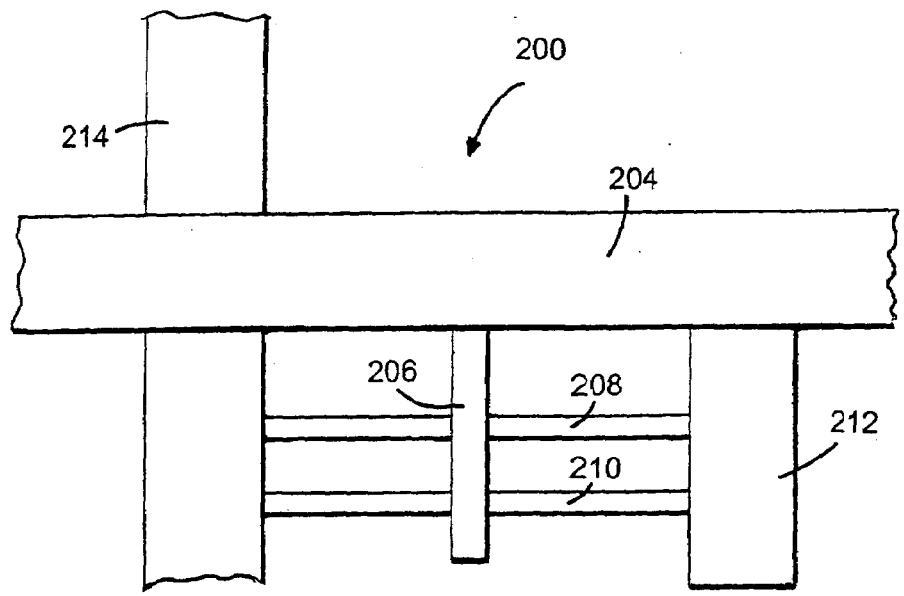
FIG. 2A is a top view of a magnetic memory device embodiment.
Figure 2B:
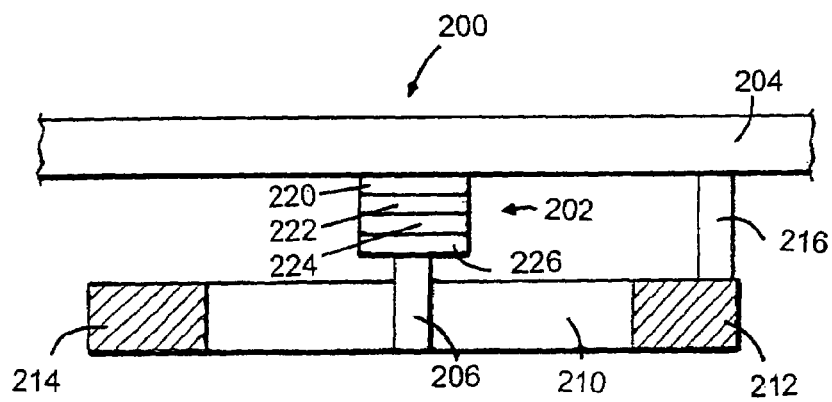
FIGS. 2B and 2C show cross sections of side views of two variations of the embodiment shown in FIG. 2A.
Figure 2C:
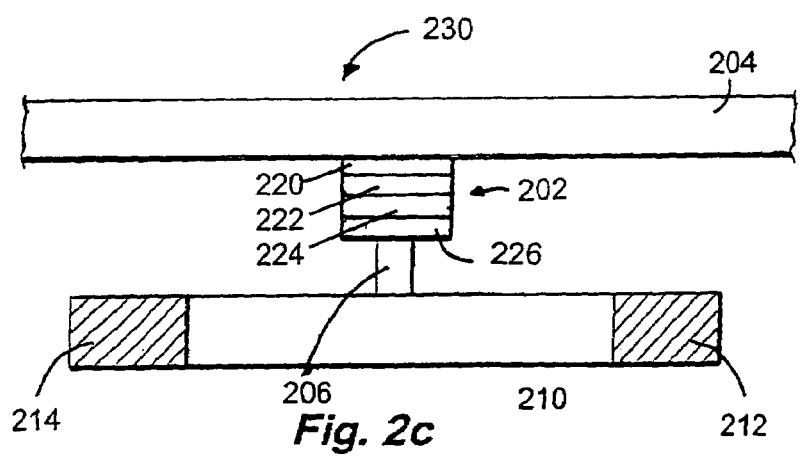

FIG. 2A shows a top view of a MRAM device according to another embodiment. FIG. 2B shows a cross-sectional view of the device shown in FIG. 2A and FIG. 2C shows a cross-sectional view of a variation of the embodiment shown in FIGS. 2A and 2B. Device 200 includes magnetic memory cell 202 which is connected to bit line 204. A gate electrode 206 is connected to fins 208 and 210 of a finFET arrangement including drain 212 and source 214. The magnetic memory cell 202 includes a data layer 220, a dielectric layer 222 and a reference layer 224. The magnetic memory cell 202 is connected to gate electrodes 206 via dielectric layer 226. The bit line 204 is connected to the drain 212 via connector 216.

The device variation shown in FIG. 2C is similar to the embodiment shown in FIGS. 2A and 2B. However, the device 230 does not have connector 216 that connects the bit line 204 with the drain 212. Therefore, the device 200 shown in FIGS. 2A and 2B is a two terminal device (the bit line 204 being one terminal and the word line/drain 214 being the other terminal) and the device 230 shown in FIG. 2C is a three terminal device (the bit line 204, the drain 212 and the drain/word line 214). The three terminal device 230 has the advantage that a voltage applied between drain 212 and source 214 can be independent from a voltage across the magnetic memory cell 202 during a readout operation. Therefore, there is another parameter that can be used to control the amplification of the finFET arrangement and that is not dependent on the sense current through the magnetic memory cell 202.

The magnetic memory cell 202, the bit line 204, the dielectric layers 222 and 226, the gate electrode 206, the fins 208 and 210, the drains 212 and word line 214 are analogous to corresponding components of device 100 shown in FIG. 1.

Figure 3:
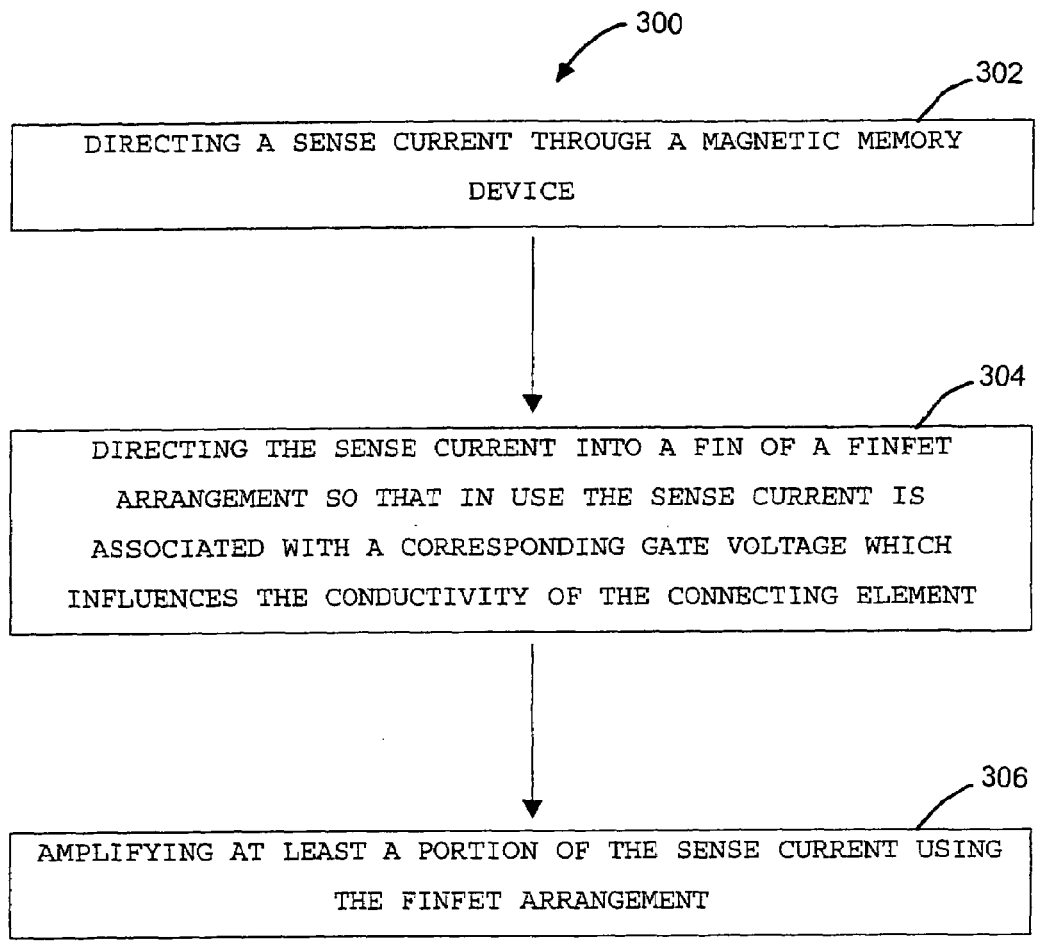
FIG. 3 is a flow-chart of a method embodiment of the invention.

FIG. 3 illustrates a method embodiment. The method 300 includes the step of directing a sense current through a magnetic memory device (step 302). The magnetic memory device is electrically connected with a finFET arrangement such as those shown in FIG. 1 or 2. The sense current is directed into the finFET arrangement in a manner so that in use the sense current is associated with a corresponding gate voltage which influences the conductivity of the fin (step 304). The finFET arrangement is then used to amplify the sense current (step 306).

Figure 4:
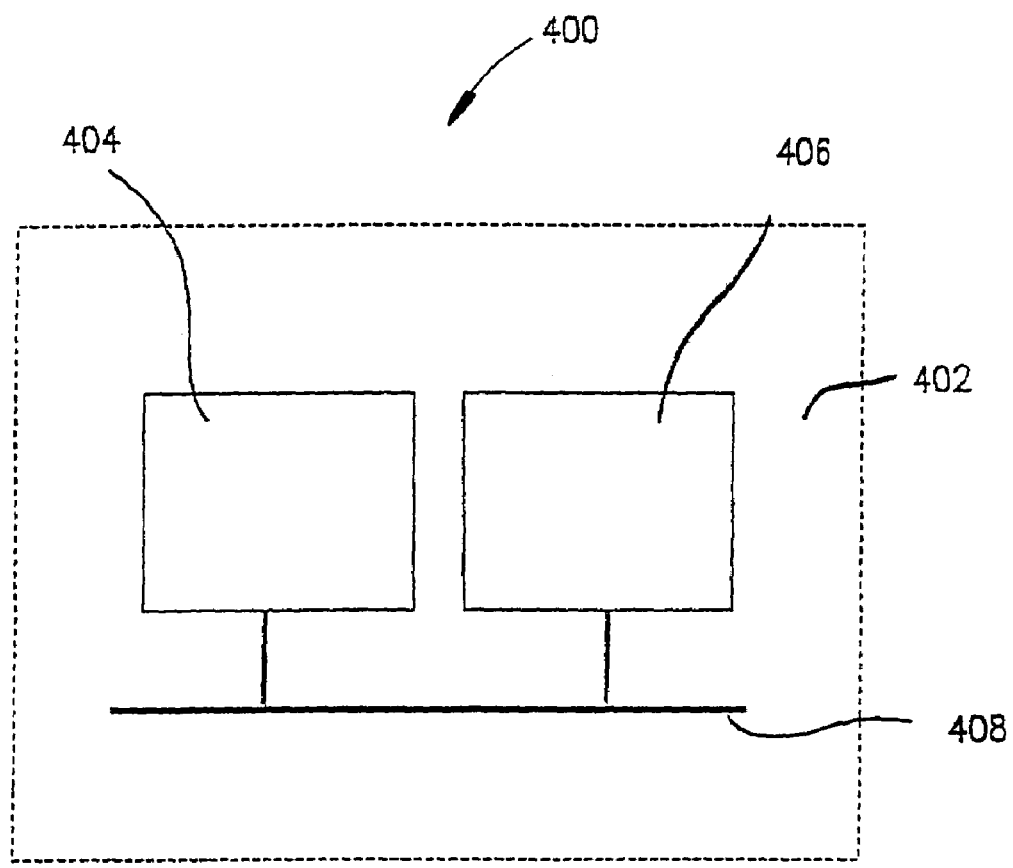
FIG. 4 is a schematic diagram of a computer system embodying the device shown in FIG. 1.

FIG. 4 shows a computer system 400 which embodies the memory device shown in FIG. 1. The computer system 400 has a main board 402 which is connected to a central processing unit 404 and magnetic memory device 406. The magnetic memory device arrays 406 includes the device shown in FIG. 1. The magnetic memory device array 406 and the central processing unit 404 are connected to a common bus 408. The computer system 404 has a range of further components which are for clarity not shown.

Figure 5A:
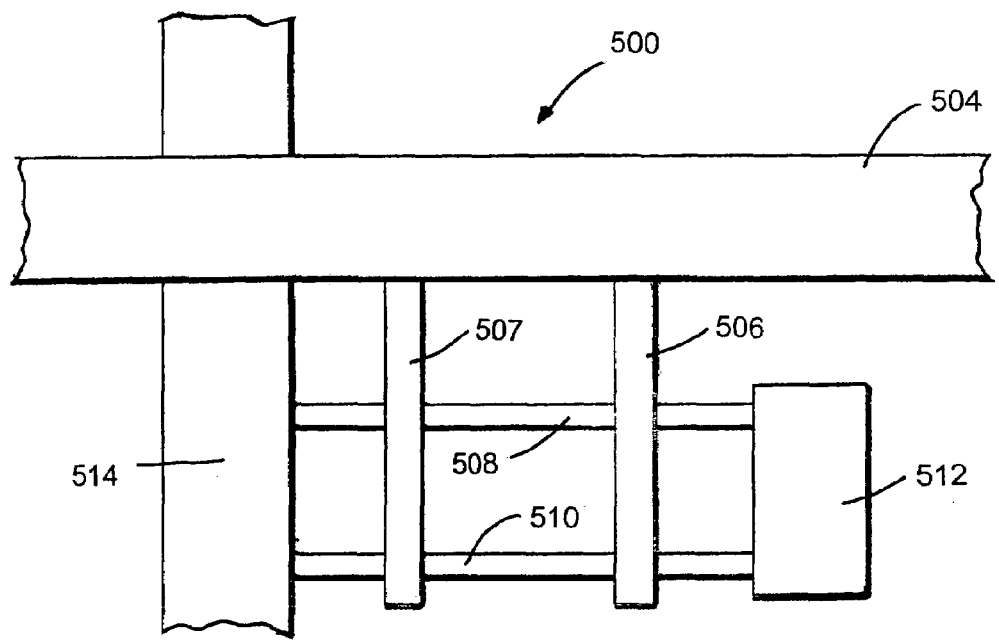
FIG. 5A is a top view of another magnetic memory device embodiment and FIG. 5B is a cross-sectional view of the magnetic memory device embodiment shown in FIG. 5A.
Figure 5B:
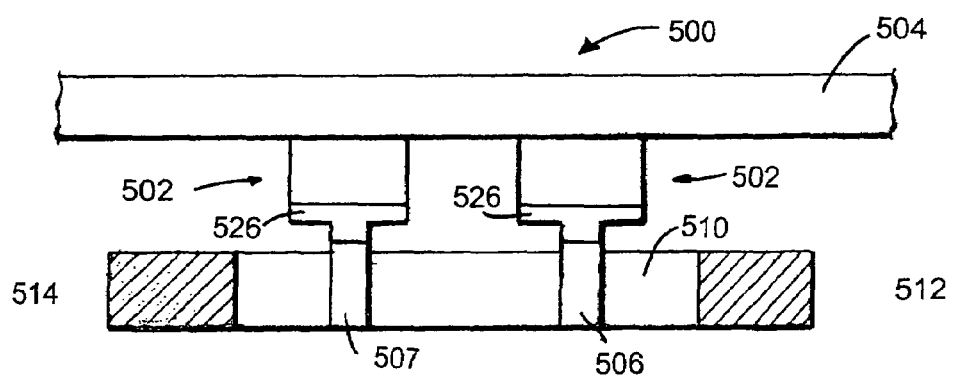

FIGS. 5a and 5b show a logic circuit 500. The logic circuit includes two magnetic memory devices 502 which are contacted by bit line 504. Each magnetic memory cell 502 is connected via a respective gate electrode 506 to fins 508 and 510 of a finFET arrangement. The finFET arrangement includes a drain 512 and a source 514 which is combined with a word line. Each gate 506 and 507 is connected to fins 508 and 510. Each magnetic memory device 502 includes a data layer, a dielectric layer and a reference layer which are analogous to those of memory cells 102 and 202 shown in FIGS. 1 and 2 respectively. Each magnetic memory cell 502 is connected to one of the gate electrodes 506 and 507 via dielectric layer 526. The composition and arrangement of the bit line 504 memory cells 502, dielectric layers 522 and 526, gate electrodes 506 and 507, fins 508 and 510, drains 512 and word line 514 are analogous to corresponding components of device 100 shown in FIG. 1.

In this embodiment the gate electrodes 506 and 507 are contacted by an external voltage source (not shown). Similar to the device 100 shown in FIG. 1, a voltage is applied between bit line 504 and word line 514 for reading out the memory cells 502 which results in a voltage across dielectric layer 526. The voltage across dielectric layer 526 is a gate voltage for the fins 508 and 510 and influences the conductivity of the fins 508 and 510. This voltage is dependent on the state of the memory cell 502, ie on the data that is stored and the data layers 520.

Similar to the device 100 shown in FIG. 1, the gate voltage influences the conductivity of the fins 508 and 510 so that the finFET arrangement amplifies the sense current. Further, the external voltage applied to the gate electrodes 506 and 507 influences the conductivity of the fins 508 and 510 and therefore the current between drain 512 and source 514. Therefore, the current from drain 512 to source 514 depends on previously stored signals in each memory cell 502 and on the gate voltage applied to each gate electrode 506 and 507. It is therefore possible to use the circuit for logic operations such as the addition of signals or other logic operations.

In general the devices 100, 200, 230, and 500 are fabricated as integrated devices using a combination of lithographic and etching processing steps.

Although the embodiments have been described with reference to particular examples, it is to be appreciated by those skilled in the art that the embodiments may take other forms. For example, the finFET arrangements may have any number of fins and any number of MRAM may be associated with a fin. Further, at least one additional conductive layer and additional insulating layer may be disposed between each MRAM cell and each word line. The additional conductive layer may be operable to carry the sense current separate from the bit-line. In this case the additional layer may be connected to the drain of the finFET arrangement while the bit-line is insulated from the drain.

The magnetic memory cells may also not necessarily be TMR devices but may use alternative technology such as colossal magneto-resistance (CMR) or giant magneto-resistance (GMR).

Further, it is to be understood that the magnetic memory cells may be positioned above, underneath or at the same level as the fins of the finFET arrangements. Further, the magnetic memory cells may be connected via resistive or dielectric layers, such as layer 126, to the fin without gate electrodes such as gate electrode 106 shown in FIG. 1. In this case the magnetic memory cells may be positioned over the fins and may overlap the fins.

What claimed is:

1. A magnetic memory device comprising:
a magnetic memory cell switchable between two states of differing electrical resistance being detectable by a sense current through the magnetic memory cell; and
a field effect transistor (FET) arrangement having a source and a drain and a connecting element connecting the source and the drain, the connecting element projecting from a portion of the device and having an electrical conductivity that varies in response to a gate voltage applied to the connecting element, the magnetic memory cell being in electrical communication with the connecting element in a manner so that at least a portion of the sense current is in use associated with a corresponding gate voltage and the FET arrangement amplifies at least a portion of the sense current.

2. The magnetic memory device of claim 1 wherein:
the connecting element comprises at least one fin projecting from the portion of the device and the FET in a fin field effect transistor (finFET).

3. The magnetic memory device of claim 2 wherein:
the magnetic memory cell is in electrical communication with more than one sides of the at least one fin.

4. The magnetic memory device of claim 1 wherein:
the magnetic memory cell is in electrical communication with at least a portion of the connecting element via a tunnelling junction which is operable as a gate for the connecting element and applies the gate voltage to the connecting element.

5. The magnetic memory device of claim 1 wherein:
the magnetic memory cell is in electrical communication with the connecting element via a resistive layer which is operable as a gate for the connecting element and applies the gate voltage to the connecting element.

6. The magnetic memory device of claim 1 wherein:
the device is a two-terminal device having drain and source terminals.

7. The magnetic memory device of claim 1 wherein:
the device is a three-terminal device having source and drain terminals and a separate gate terminal so as to influence the conductivity of the connecting element.

8. The magnetic memory device of claim 6 wherein:
the magnetic memory cell is series connected between the drain and the connecting element.

9. The magnetic memory device of claim 7, wherein:
the magnetic memory cell is series connected between the drain and the connecting element.

10. The magnetic memory device of claim 1 wherein:
the magnetic memory cell has a magnetic reference layer and a magnetic data layer, the reference layer being in electrical communication with the connecting element and the data layer being in electrical communication with the drain.

11. The magnetic memory device of claim 1 wherein:
the magnetic memory cell is positioned adjacent the connecting element.

12. The magnetic memory device of claim 1 wherein:
the magnetic memory cell is positioned over the connecting element.

13. The magnetic memory device of claim 1 wherein:
the magnetic memory cell overlaps the connecting element.

14. The magnetic memory device of claims 3 wherein:
the magnetic memory cell comprises a data layer and a reference layer separated by a tunnelling junction which is of a size different to that of the tunnelling junction which is operable as a gate for the connecting element.

15. The magnetic memory device of claim 1 comprising more than one memory cells which are in electrical communication with the connecting element.

16. The magnetic memory device of claim 1 comprising more than one connecting element connecting the source and the drain and more than one magnetic memory cell which are in electrical communication with the connecting elements.

17. The magnetic memory device of claim 16 comprising an array of magnetic memory cells.

18. The magnetic memory device of claim 3 wherein:
the tunnelling junction includes a dielectric layer comprising at least one material of $Al_2O_3$, AlN, $SiO_2$, $Si_3N_4$, BN, MgO and $Ta_2O_5$.

19. The magnetic memory device of claim 6 wherein:
the resistive layer includes at least one material of Si, Ge, Se, C, SiC, $TaO_2$, WSi, CoSi, FeSi, PtSi, TaN, FeAlN and SiN.

20. The magnetic memory device of claim 1 wherein: the magnetic memory cell is one of an array of magnetic memory cells and the FET is one of a plurality of FET's having connecting elements that are in electrical communication with respective memory cells of the array.

21. A magnetic memory device comprising:
a magnetic memory cell switchable between two states of differing electrical resistance being detectable by a sense current through the magnetic memory cell; and
a fin-field effect transistor (finFET) arrangement having a source and a drain and a fin connecting the source and the drain, the fin projecting from a portion of the device and having an electrical conductivity which varies in response to a gate voltage applied to the fin, the magnetic memory cell being in electrical communication with the fin via a tunnelling junction in a manner so that at least a portion of the sense current is in use associated with a corresponding gate voltage and the finFET arrangement amplifies at least a portion of the sense current.

22. A computer system comprising:
a central processing unit,
a main board coupled to the central processing unit and a magnetic memory device coupled to the main board, the magnetic memory device comprising:

an array of magnetic memory cells each being switchable between two states of differing electrical resistance being detectable by a sense current through the magnetic memory cell; and
a plurality of FET arrangements, each having a source and a drain and a connecting element projecting from a portion of the device, the connecting element having an electrical conductivity that varies in response to a gate voltage applied to the connecting element, the magnetic memory cell being in electrical communication with the connecting element in a manner so that at least a portion of the sense current is in use associated with a corresponding gate voltage and the finFET arrangement amplifies at least a portion of the sense current.

23. A method of operating a magnetic memory device, the device comprising a magnetic memory cell switchable between two states of differing electrical resistance being detectable by a sense current through the magnetic memory cell, the magnetic memory cell being in electrical communication with a field effect transistor (FET) arrangement having a connecting element that projects from a portion of the device and connects the source and the drain of the FET arrangement, the method comprising the step of:
directing at least a portion of the sense current into the connecting element in a manner so that in use the sense current is associated with a corresponding gate voltage which influences the conductivity of the connecting element; and
amplifying at least a portion of the sense current using the FET arrangement.

24. The method of claim 23 wherein:
the connecting element comprises at least one fin and the step of directing the sense current is conducted so that the at least a portion of the sense current is directed into the at least one fin from more than one side of the at least one fin.

25. An electronic circuit comprising:
a plurality of magnetic memory cells, each magnetic memory cell being switchable between two states of differing electrical resistance being detectable by a sense current through the magnetic memory cell; and
a fin-field effect transistor (finFET) arrangement having a source and a drain and at least one fin connecting the source and the drain, the at least one fin projecting from a portion of the circuit and having an electrical conductivity which varies in response to a gate voltage applied to the at least one fin, the magnetic memory cell being in electrical communication with the at least one fin in a manner so that at least a portion of the sense current is in use associated with a corresponding gate voltage and the finFET arrangement amplifies at least a portion of the sense current.

26. A logic circuit comprising the circuit of claim 25 wherein:
the circuit has a separate gate electrode for the at least one fin and current between source and drain is in use dependent on at least one voltage applied to the at least one gate electrode and on at least a portion of the sense current associated with each magnetic memory cell.

* * * * *